Figure 1:
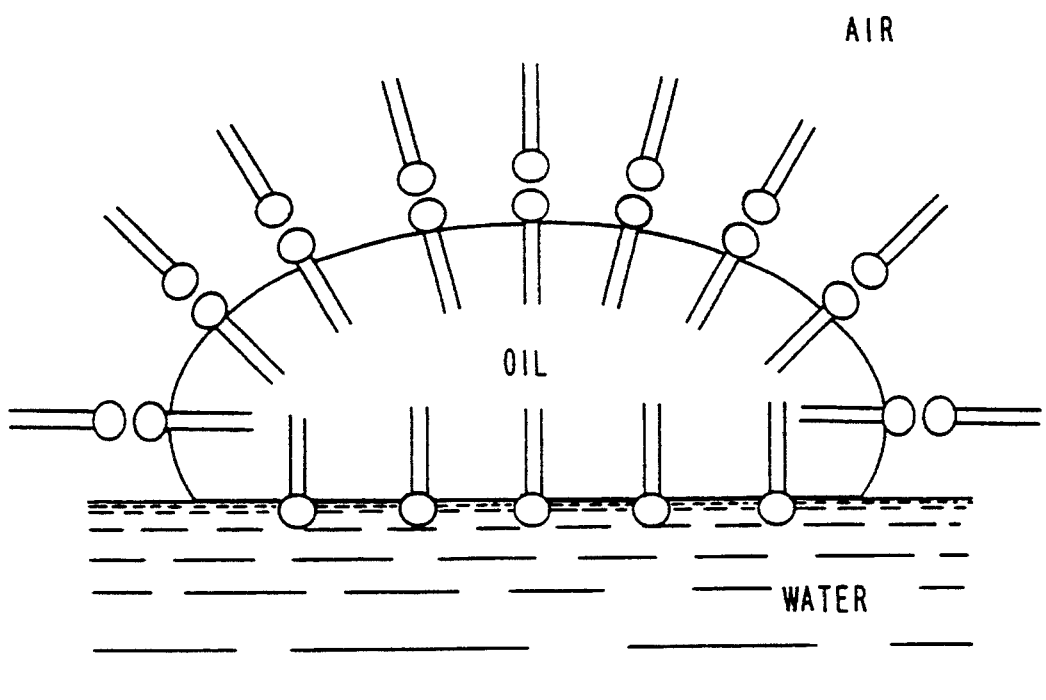

United States Patent [19]
Gatt et al.

[11] Patent Number: 5,401,413
[45] Date of Patent: * Mar. 28, 1995

[54] METHOD FOR ENHANCING THE BIODEGRADATION OF BIODEGRADABLE ORGANIC WASTES

[75] Inventors: Shimon Gatt; Yechezkel Barenholz; Herve Bercovier, all of Jerusalem, Israel

[73] Assignee: Yissum Research Development Company of the Hebrew University of Jerusalem, Jerusalem, Israel

[ * ] Notice: The portion of the term of this patent subsequent to Sep. 14, 2010 has been disclaimed.

[21] Appl. No.: 653,319

[22] Filed: Feb. 11, 1991

[51] Int. Cl.$^6$ .............. A62D 3/00; B09B 3/00; C02F 1/40
[52] U.S. Cl. .................. 210/610; 210/749; 210/922; 210/925; 134/40; 435/281
[58] Field of Search ............ 210/610, 611, 922, 601, 210/632, 749, 776; 134/40; 435/281

[56] References Cited

U.S. PATENT DOCUMENTS

| | | | |
|---|---|---|---|
| 4,087,356 | 5/1978 | Masconi et al. | 210/922 |
| 4,146,470 | 3/1979 | Mohan et al. | 210/922 |
| 4,230,562 | 10/1980 | Olivieri et al. | 210/610 |
| 4,284,509 | 8/1981 | Lindörfer et al. | 210/922 |
| 4,382,873 | 5/1983 | Gatellier et al. | 210/610 |
| 4,414,333 | 11/1983 | Olivieri et al. | 210/610 |
| 4,462,910 | 7/1984 | Lepain et al. | 210/610 |
| 4,623,468 | 11/1986 | Lepain et al. | 210/922 |
| 4,822,490 | 4/1989 | Dyadechko et al. | 210/922 |
| 5,019,174 | 5/1991 | Wallach | 134/40 |

FOREIGN PATENT DOCUMENTS 2172796 5/1973 France .

OTHER PUBLICATIONS

G. W. Gould and J. L. Corey, "Microbial Growth and Survival in Extremes of Environment", Academic Press, 1980.
E. H. Beachey, "Bacterial Adherence", Chapman and Hall, 1980.
Dwayne C. Savage and Madilyn Fletcher, "Bacterial Adhesion. Mechanisms and Physiological Significance": Plenum Press, 1985.
K. Jann and B. Jann, "Bacterial Adhesins", Springer-Verlag, 1990.
D. Lichtenberg et al, "Liposomes: Preparation, Characterization and Preservation", Methods of Biochemical Analysis, vol. 33, pp. 337–462, Wiley, 1988.
Ronald M. Atlas, "Petroleum Microbiology", MacMillan, 1984.
Kenneth D. Racke and Joel R. Coats, "Enhanced Biodegradation of Pesticides in the Environment" American Chemical Society, 1990.
Miller et al, "Evidence From Liposome Encapsulation For Transport-Limited Microbial Metabolism of Solid Alkanes", *Applied and Environment Microbiology*, vol. 55, No. 2, Feb. 1989, pp. 269–274.
Barr, "Liposomal Solution For Microbial Catalysis In Organic Solvents?", *Trends In Biotechnology*, vol. 6, No. 1, Jan. 1988, pp. 1–2.
Thomas et al, "In Situ Biorestoration of Organic Contaminants in the Subsurface", *Environmental Science & Technology*, vol. 23, No. 7, Jul. 1989, pp. 760–766.

*Primary Examiner*—Thomas Wyse
*Attorney, Agent, or Firm*—Lowe, Price, LeBlanc & Becker

[57] ABSTRACT

The invention provides a composition for enhancing the biodegradation of biodegradable organic wastes comprising a combination of organic-waste consuming microorganisms and liposomes wherein the liposomes supply essential nutrients for bacterial growth while concomitantly increasing the polarity and wettability of the waste, thereby increasing their availability for enhanced bacterial interaction therewith and methods for the use thereof.

7 Claims, 2 Drawing Sheets

METHOD FOR ENHANCING THE BIODEGRADATION OF BIODEGRADABLE ORGANIC WASTES

The present invention relates to a composition for enhancing the biodegradation of biodegradable organic wastes and to methods utilizing the same.

More particularly, the present invention relates to compositions and methods for enhanced biodegradation and/or recovery of hydrocarbons including the cleanup of hazardous hydrocarbon wastes.

Prior research, patents and applications have been directed to enhanced oil recovery.

Thus, e.g., there is described and claimed in U.S. Pat. No. 4,811,791 a method of recovering a petroleum from an underground source thereof comprising injecting into said underground source a petroleum displacement agent comprising a fluid and a modified liposome, said liposome being present in an amount sufficient to lower the interfacial tension between said fluid and said petroleum to below about 50 millidynes.

In U.S. Ser. No. 07/322,601 there is described and claimed a displacement agent for recovery of a petroleum from an underground source comprising a petroleum displacing water molecules and a liposome modified by peroxidation and/or other procedures and being a dispersion of sealed vesicles.

Both of these specifications are based on the use of liposomes and modified liposomes to reduce the interfacial tension between the hydrocarbon trapped in the underground source and the water and/or aqueous displacement fluid found therein to enable the release and removal of said hydrocarbons.

As described in said specification, in addition to presently existing dumps containing such wastes which must be cleaned, there are numerous instances at industrial sites such as petroleum tank farms, chemical plants and elsewhere where crude or refined hydrocarbons, such as oil, gasoline, or the like, are spilled on the ground or into bodies of water such as ponds, lakes and oceans. Such wastes not only spread out and soak through the surface of the ground but seep into the ground and often float on the water table or disperse in the ground water.

Presently cleanup involves procedures such as excavation of the soil and incineration of the soil followed by disposal to a suitable disposal site. This is not only costly, but decontamination is often not complete and the disposal site then itself becomes a hazardous site.

An alternative to this costly disposal method is "washing" of the contaminated soil. This involves drilling one or more interceptor wells around the contaminated site to intercept the plume of hazardous material. It is preferred to flush or wash the contaminated soil with water, preferably water containing one or more surfactants, by spraying the site and allowing the water to percolate down through the soil and assist in "washing" the soil and driving the waste to the interceptor well or wells. This technique has been and is used around refineries to recover crude and refined hydrocarbons and on the larger sites the solvent system (water or water and surfactant) can be stripped of the hazardous waste and recycled for spraying to minimize costs. Presently the cost of "soil washing" is very high because of the cost of the surfactants and the fact that it may take years of spraying and recycling of solvent to wash the hazardous waste from the site and lower the amount of waste to an acceptable level, The surfactants might present an ecological hazard and they are not entirely effective which increases the time required to wash the soil, In contradistinction to the previously suggested methods and agents, the present invention provides a composition and method for the enhanced biodegradation of oil from an underground source thereof for removal of deposited heavy hydrocarbonaceous materials from well bores and tubing strings and for readily cleaning up sites contaminated with hydrocarbons both on land and at sea, which can be carried out efficiently without effecting the ecology and at relatively low cost.

In addition to petroleum, among the wastes which could be treated according to the present invention are:
1. Aromatic hydrocarbons (e.g., toluene, xylene, phenanthrene, chrysene).
2. Nitro aromatics.
3. Creosote.
4. Chlorinated Aliphatics (e.g., tri-or tetrachloroethylene).
5. Chlorinated Aromatics (e.g.. penta- or hexachlorobenzene, pentachlorophenol).
6. Poly carbonated biphenyl.
7. Pesticides (PHA's, TNT, RDS).
8. Xenobiotics.

The compositions and methods of the present invention are preferred for use wherein said organic waste is selected from crude and refined hydrocarbons and especially wherein said organic waste is crude oil, an oil spill on water or contaminated soil.

Thus the present invention provides a composition for enhancing the biodegradation of biodegradable organic wastes comprising a combination of organic-waste consuming microorganisms and liposomes wherein said liposomes supply essential nutrients for bacterial growth while concomitantly increasing the surface area and modifying the polarity and availability of said waste for enhanced bacterial interaction therewith.

The invention also provides a method for enhancing the biodegradation of biodegradable organic wastes comprising applying lipsosomes to an organic waste site wherein said liposomes supply essential nutrients for bacterial growth while concomitantly increasing the polarity and wettability of said waste thereby making it more available for enhanced bacterial interaction therewith.

As is known, oil is a poor substrate for most microorganisms. Being a hydrocarbon it contains only carbon and hydrogen; an external source of nitrogen, phosphorus and other essential nutrients is needed to support bacterial growth (Lichtenberg, D. and Barenholz Y., 1988; Gould, G. W. and Corey, J. L., Eds. Microbial Growth and Survival in Extremes of Environment; Academic Press, 1980).

Being very hydrophobic, oil does not interact with water and forms a separate phase. The forces which prevent its interaction with water also reduce, very considerably, interaction of the oil with other surfaces including those of most microorganisms. (Beachey, E. H., Ed.: Bacterial Adherence, Chapman and Hall, 1980; Berkely et al. Eds: Elis Horwood, Chichester, England, 1976; Savage, D. C. and Fletcher, M., Eds: Bacterial Adhesion. Mechanism and Physiological Significance, Plenum, 1985; Jann, K. and Jann, B. Bacterial Adhesions, Springer-Verlag, 1990; Atlas, R. M., Ed: Petroleum Microbiology, MacMillan, 1984).

Being composed of phospholipids (Szuhaj, B. F., Ed: Lecithin: Sources, Manufacture, Uses. Am. Oil Chem. Soc. 1989), liposomes (Lichtenberg, D. and Barenholz, Y. Methods of Biochemical Analysis (D. Glick, ed.) Vol. 33, pp. 337–462, Wiley, 1988) can serve as a source of carbon, hydrogen, phosphorus and nitrogen and, because of their vesicular structure, they can be used as a reservoir of encapsulated nutrients, minerals and growth factors.

Furthermore, it has now been found as described hereinafter that liposomes modify the physical properties of oil or hydrophobic wastes, thereby increasing their availability to microbial degradation.

The composition and method of the present invention can utilize any of the presently known or further discovered microorganisms (e.g. such as mixtures of microorganisms present in and isolated from natural flora) which are capable of degrading hydrocarbons including:

*Arthrobacter paraffinens*
Arthrobacter sp.
Mycobacterium
*Rhodococcus rhodochrous*
Rhodococcus sp.
Achromobacter sp.
*Acinetobacter calcoaceticus*
Acinetobacter sp.
*Nocardia globerula*
*Nocardia paraffinae*
Nocardia sp.
Pseudomonas sp.
Bacillus sp.
Clostridium sp.
Corynebacterium sp.
Flavobacterium sp.
Candida sp.
Aspergillus sp.
Rhodotorula sp.
Fusarium sp. and
Penicillium sp.

Phospholipids, which are the raw materials composing the liposomes used in the present invention are naturally occurring membrane-lipids in which glycerol is linked to two long chain fatty acids, a phosphoric acid residue and a nitrogen-containing base (e.g. choline). While most phospholipids of animal origin have one saturated and one unsaturated fatty acid, plants (e.g. soybean) supply phospholipids having mostly two polyunsaturated fatty acids. For large scale application of liposomal phospholipids for environmental aspects, availability and a low cost are two major prerequisites. Plant phospholipids fulfill both requirements: their potential yield is more than half-a-million tons per year and, as by-products of the edible oil industry; they are being used for animal feed, inclusion in food products, cosmetics, pharmaceuticals and for technical applications such as workup of leather and as components of paints (Berkely et al. Eds: Elis Horwood, Chichester, England, 1976).

The phospholipids are classified according to their polar headgroups into three major classes: 1) neutral-zwitterionic phosphatidylcholine (PC) referred to as lecithin; 2) less hydrophibic-amphoteric phospholipids such as phosphatidylethanolamine (PE), and 3) negatively-charged phospholipids such as phosphatidylglycerol (PG) or phosphatidylinositol (PI). While the cost of crude phospholipids (e.g. from soybean or rapeseed) is less than $1 per kg, that of highly purified lecithin may be a thousand fold or even more expensive.

Liposomes (Lichtenberg, D. and Barenholz, Y. Methods of Biochemical Analysis (D. Glick, ed.) Vol. 33, pp. 337–462, Wiley, 1988) are bilayered structures which can be multilamellar, oligolamellar or unilameller. The liposomes are sealed vesicles ("microsacs") having a bilayered membrane composed of phospholipids and containing water in their interior. In the latter, one can encapsulate water-soluble compounds such as minerals, sugars, amino acids, vitamins, hormones, drugs, growth factors, etc. The lipid bilayer acts as a barrier which maintains these compounds within the liposome. The membrane of the vesicle, which is composed of two monolayers of phospholipids (tail to tail), is hydrophobic in its interior and hydrophilic in its two respective exteriors, thereby permitting entrapment of a variety of lipophilic or amphiphilic compounds, neutral or charged.

Numerous methodologies have been developed for preparation of liposomes (ibid); they can be prepared in various sizes and number of lamellae. In most cases unilamellar liposomes are preferred. The preparation of small unilamellar liposomal vesicles (SUV) on a small scale, can be achieved by ultrasonic-irradiation or extrusion of hydrated phospholipids. For large scale preparation, phospholipids are hydrated by mechanical shaking of dry phospholipids in water (or water containing salts and nutrients as specified above). The multilamellar liposomes thus formed are then homogenized in dairy-homogenizers which provide a high shearing force. Using this approach were produced small, unilamellar vesicles of natural or modified soybean phosphatides of 20–80 nm in diameter, which were stable to storage at room temperature in regular or sea-water, resisting aggregation or fusion for at least two years.

In the last several years we have studied the effect of the composition of various natural or modified soybean phospholipids on the size, physical properties and stability of the liposomes as well as their ability to withstand the action of high ionic strength and divalent ion concentration present in sea-water and oil wells. Our results suggested that neither PE nor negatively-charged phospholipids, such as PI, reduce the stability of the liposomes in the above salt-containing media. We have therefore developed procedures for increasing the proportion of the neutral phospholipids without considerably increasing the cost.

As stated, in accordance with the present invention, liposomes facilitate cleanup of contaminated soils or oil spilled on water by a combined effect, i.e., a concerted operation which enhances bacterial growth by supplying essential nutrients while concomitantly modifying the physical state of oil or wastes, thereby making them accessible to interaction with, and degradation by, microorganisms.

The phospholipids which make up the liposomes are composed of glycerol, fatty acids and choline ethanolamine, or inositol. Element analysis shows that they also contain about 4% phosphorus and 2% nitrogen. They can thus, by themselves supply nutrients for growth of oil-degrading microorganisms, Being sealed capsules, a broad spectrum of nutrients, minerals and growth factors can be entrapped in the liposomes and released slowly, over prolonged periods to the microorganisms.

These nutrients and growth factors could be divided into two main categories:

1. Hydrophilic compounds (including minerals) which could be encapsulated in the internal aqueous compartment of the sealed liposomes. These will remain entrapped and their spontaneous release (which could be controlled by the lipid composition) will occur continuously into the microbial environment. In addition, the release of these compounds will occur when the microorganisms attack or digest the lipids that compose the liposomes.

2. Hydrophobic or amphiphilic growth factors could be incorporated into the lipid bilayers of the liposomes and thereby delivered to the microorganisms. This could permit supplying essential fatty acids, fat-soluble vitamins and growth factors and a naturally occurring sulfolipid (cerebroside sulfate, sulfatide) which would supply sulfur to microorganisms requiring it. The above should permit "custom-tailoring" of liposomes for delivering suitable nutrients required for the proliferation of microorganisms capable of degrading specific oil (Atlas, R. M., Ed: Petroleum Microbiology, MacMillan, 1984) or wastes (Racke, K. D. and Coats, J. R., Eds: Enhanced Biodegradation of Pesticides in the Environment. Am. Chem. Soc. 1990) in a broad spectrum of environmental conditions.

According to the present invention and as demonstrated hereinafter in the examples it has now been found that liposomes composed of phospholipids induce a 5-6 logs enhancement of growth of bacteria present in soil contaminated with petroleum. When these bacteria were collected and further incubated in water in presence of crude petroleum, addition of liposomes increased the bacterial growth by 5 log fold.

The above bacteria whose growth was enhanced by lipsomes oxidized $^{14}C$-hexadecane to $^{14}CO^2$, induced changes in the physical state of the oil, modified the color of the medium to which black, crude petroleum was added and caused the appearance of emulsions, All this indicated that liposomes facilitated growth of oil-degrading microorganisms present in the petroleum-contaminated soil.

Facilitation by liposomes of growth of oil-degrading bacteria was tested in the following two sets of experiments: In the first series of experiments, soil, contaminated with petroleum was collected from a local gas station and incubated in minimal medium, to which Alaska crude oil was added. Bacteria which grew in the medium were collected, used to inoculate minimal medium to which Alaskan oil and unilamellar liposomes were added (final concentration of phospholipid 0.15%). Several liposomal preparations were employed composed of partially or fully purified PC of soybean or egg yolk as well as fully hydrogenated, phosphatidylcholine. In all cases the presence of the liposomes increased the bacterial count 2-3 logs after 3 days of incubation at 30°. To determine the optimal and minimal inhibitory concentrations (MIC) of liposomes for bacterial growth, an aliquot ($3 \times 10^3$ bacteria) of the above bacteria were incubated in 1 ml minimal essential medium with unilamellar liposomes composed of soybean lecithin which we have modified to provide a preparation suitable for preparation of stable liposomes (S45-M) and which provided IFT values of about 5 millidynes per cm. After 5 days incubation at 30°, in absence of liposomes, the bacterial count was about equal to the inoculum (i.e. $3 \times 10^3$), while in the presence of liposomes the following values for bacterial count per ml were obtained: 0.05% phospholipid—$5 \times 10^7$; 0.1% $1 \times 10^9$; 0.2% $2 \times 10^6$; 0.4 and 0.8% less than $10^3$. This indicated that for the above example an optimal value of about 0.1% and an MIC of about 0.4% liposomal phospholipids.

In another extended series of experiments, soils contaminated with petroleum, were obtained from the oil-loading terminal at Israel's southern port of Eilat and used as source for bacteria. Two soils were obtained—a dry soil (ECS-A) and an oily, "wet" soil (ECS-B). These respective soils were incubated at 30° C. in distilled water in the absence of or presence of S45-M small unilamellar liposomes. In some experiments $^{14}C$-hexadecane was also added and the $^{14}CO_2$ collected on Hyamine-hydroxide and was counted. The results may be summarized as follows:

1. In all cases addition of liposomes induced a several log increase of bacterial growth. Thus, incubation of 1 g of each of the respective soils in 20 ml of tap water, for 4 days at 30° resulted in a bacterial count per ml of about $5 \times 10^5$. Similar incubation in the presence of S45-M small unilamellar liposomes (final phospholipid concentration—0.125%) increased the count per ml to $3 \times 10^7$ using ECS-A and to greater than $10^9$ when using ECS-B, i.e., representing a 4-5 log increase. Concentrations of liposomes greater than 0.25% phospholipids were somewhat inhibitory. When incubation of the "wet" oil-contaminated soil (ECS-B) was continued for 2 weeks or more, a whitish opaque emulsion appeared in the liposome-containing flasks but not in their counterparts from which liposomes were omitted.

2. In an experiment aimed at ascertaining that bacteria, grown on the contaminated soils indeed degraded hydrocarbons, 2 g of the above soils were incubated in 2 ml of distilled water in the absence or presence of S45-m liposomes (final phospholipid concentration of 0.25%); 40 l of $^{14}C$-hexadecance were also included. In the presence of the liposomes, the count per ml was $9 \times 10^8$ and $4 \times 10^9$ for ECS-A and ECS-B, respectively. The $^{14}CO_2$ collected was equivalent to oxidation of 0.36 l and 0.5 $^{14}C$-hexadecane for the above two soils, respectively. In the absence of liposomes only half these quantities were oxidized.

3. Bacteria obtained by incubating soils ECS-A and ECS-B in minimal medium were and further incubated in 5 ml distilled water and 0.5 ml Alaska crude oil for 4 days at 30° . In the presence of unilamellar S45-M liposomes (0.3% phospholipid) the bacterial count per ml increased from $2 \times 10^3$, without liposomes to $3 \times 10^8$, i,e, more than 5 logs.

4. The soils ECS-A and ECS-B were also incubated in distilled water with other liposomal preparations composed of egg, soybean or hydrogenated fully saturated phosphatidylcholines. Although some variations have been observed, all the respective liposomes produced in an increased bacterial count. The results indicated that saturated PC is considerably less efficient for enhancing bacterial growth than its unsaturated equivalent. Also, lecithin still containing PE and some PI was less efficient than the product (SM45-M) in which we have converted the PE to PC.

5. Of very considerable interest were the experiments in which petroleum-contaminated soils were sprayed with a solution of phospholipids in a suitable solvent. The solvent was evaporated and the phospholipid-coated soil hydrated with water. After two weeks incubation their bacterial content was measured. It was most striking that in absence of water a basal value of 1-

$3 \times 10^3$/ml was obtained, Adding water increased this by 2 logs while, in the presence of water and liposomes the increase was 4-6 logs, In summary, the above preliminary experiments indicate that liposomes induced a very considerable (up to 5-6 logs) enhancement of growth of bacteria present in a natural "environmental-hazard", i.e. soil contaminated with petroleum. When these bacteria were collected and further incubated with crude petroleum, addition of liposomes increased the bacterial count by another 5 logs. The bacteria whose growth was induced by the liposomes oxidized $^{14}$C-hexadecane and induced visible changes in the appearance of the oil, including its emulsification.

Solid materials are frequently deposited in oil-well bores and on tubing string; this occurs when the oil is cooled below the cloud point of the crude oil. Treatment of deposit build-up can be mechanical, thermal or chemical. To simulate dispersion of paraffin compounds by phospholipid-liposomes, experiments were conducted for us at NIPER. Several waxes were selected, e.g. polywaxes (Polywax 500, approximately $C_{16}-C_{58}$ or Polywax 655, approximately $C_{24}-C_{100}$); polymers of ethylene that are similar to petroleum waxes; commercial canning paraffin and scrapings of tubing strings near the perforation in a San Andreas producing well in Texas. Experiments done with liposomes suggested that the best dispersion occurs above the melting points of the waxes and when a light hydrocarbon was emulsified in the liposomes, the liposome-light-hydrocarbon emulsions were also effective in preventing the re-deposition of the suspended paraffins. Numerous tests were carried out, on a laboratory scale, simulating treatment of soils contaminated with oil. For this purpose various oils (e.g. light oils, Alaskan crude oil or machine oil) were spread on silica, sand or earth. Also, earth contaminated with heavy heating oil was used. Liposomes were added without or with shaking and the released oil measured. In all cases part of the oil floated on top of the water layer, another part remained dispersed in the aqueous (liposome-containing) medium and could be collected by centrifugation. A considerable portion of the total oil could thereby be recovered. As in previous cases, the bulk of the liposomes remained intact, could be separated from the extruded oil and reutilized for further cleanup.

From the above, it will be realized that the method and composition of the present invention are equally applicable for the treatment of deposits from bores or tubing strings as well as for treatment of oil spilled on soil as will also be seen from the examples hereinafter.

Currently there are two basic approaches to physical cleanup of oil spilled on a water surface: dispersal by detergents or containment and recovery. For the latter, progress of the oil is prevented by a barrier of floating booms and collection is achieved by skimmers, sorbents or manual methods.

We have done numerous laboratory experiments to define the effects which application of phospholipids have on oil spread on water. For this purpose we have compared liposomes of a wide variety of phospholipids, from the crudest to the purest; from polyunsaturated to hydrogenated; unilamellar and multilamellar. Numerous oils were used ranging from hexane, through Alaskan crude to solid tetracosane ($C_{24}H_{50}$) and liposomes were prepared in distilled, tap, seawater or saline and various solutions of divalent ions. We have also compared the effects of the liposomes with those produced by numerous detergents (nonionic, anionic sulfonates, commercial dispersants, e.g., Corexit 9527, as well as sodium oleate).

The results can be summarized as follows:

1. Addition of traces of the liposomal dispersion to water having oil spilled on it immediately pushes away thin layers of oil forming viscous, condensed oil droplets.

2. Addition of oil onto water which already contains liposomes, results in its coalescence into viscous, condensed droplets.

3. The lecithin-treated droplets adhere to and can be collected by many objects, such as wetted paper, cloth, glass, ceramics, etc. 4. Gentle shaking of thick layers of oil on liposome-containing water results in formation of small droplets which rise to the surface but do not coalesce into a uniform oil layer.

5. Vigorous shaking of the above results in smaller droplets which rise slowly to the surface and do not coalesce. 6. Extensive ultrasonic irradiation of the above results in formation of much smaller droplets which stay dispersed, in the aqueous phase, for extended periods.

7. Treating oil on water with liposomes as described above, followed by gentle shaking or stirring, results in tight adherence of the condensed, viscous droplets to the surface of the container (i.e. glass, plastic or ceramic). Up to nearly 100% of the oil can thus be adsorbed onto the surface of the container. Droplets which do not adhere to the surface of the container can be collected by objects such as paper and cloth, glass, plastic, ceramic. The oil which adheres to the surface of the container can be dislodged by a light hydrocarbon, such as hexane.

It has thus now also been found that liposomes modify the physical state of oil spilled on water. In our previous specification there was described our earlier discovery that liposomes dislodge and modify the physical state of oil entrapped in underground reservoirs or spilled on soil. In the latter cases, the residual oil is entrapped in small capillaries and because of the high interfacial tension which exists between oil and water, the latter cannot detach oil molecules nor facilitate their moving out of the capillaries. Addition of liposomes composed of phospholipids having a low content of PE and PI caused a massive reduction (up to 10–50 thousand fold) of the interfacial tension, enabling oil molecules to break out of the capillaries, coalesce and be pushed by the water to the surface.

It has now been found and discovered that the interaction of phospholipid liposomes with oil spread on water is of an entirely different nature. Dissimilar to oil attached to soil, there are no capillaries and no need for detachment of any sort from an external surface. Also, there is no obligatory necessity for a composition low in PE and PI. The oil which is spread on the water has two interfaces: oil-water and oil-air. While in the latter, the interfacial tension is relatively low (less than 20 dynes per square cm), that of the oil-water interface is high (above 50 dynes per square cm). Because of the lower oil-air interfacial tension, molecules of oil follow the law of gravity, moving towards and spreading on large areas of the water surface. But, because of their hydrophobic nature, there is no interaction even between very thin layers of oil molecules and those of the water underneath them.

Liposomes can be prepared from phospholipids which may be supplied in a dry state or, on a solution of phospholipid in an organic solvent which is either immiscible with water (e.g., ether, alkylhalides etc.) or miscible with water (e.g., alcohols, dimethylsulfoxide etc). For dispersion as liposomes, the first step involves adding water which hydrates the phosphatides and transforms them to multilamellar liposomes (MLV). Alternatively, the above solutions in organic solvent can be mixed with water. In both cases, MLVs are produced. For conversion to small, unilamellar liposomes (SUV), these can be subjected to ultrasonic irradiation or to a variety of procedures of extrusion through filters or small pores. For large scale preparation dairy homogenizers, micro fluidizers and similar technologies can be used. The liposomes can be stored as a concentrated suspension, or even as a lyophilized powder.

The invention will now be described in connection with certain preferred embodiments with reference to the following examples and illustrative figures so that it may be more fully understood.

With reference to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. Similarly, the following examples which include preferred embodiments will serve to illustrate the practice of this invention, it being understood that the particulars shown are by way of example and for purposes of illustrative discussion of preferred embodiments of the present invention only and are presented in the cause of providing what is believed to be the most useful and readily understood description of formulation procedures as well as of the principles and conceptual aspects of the invention.

Figure 2A:
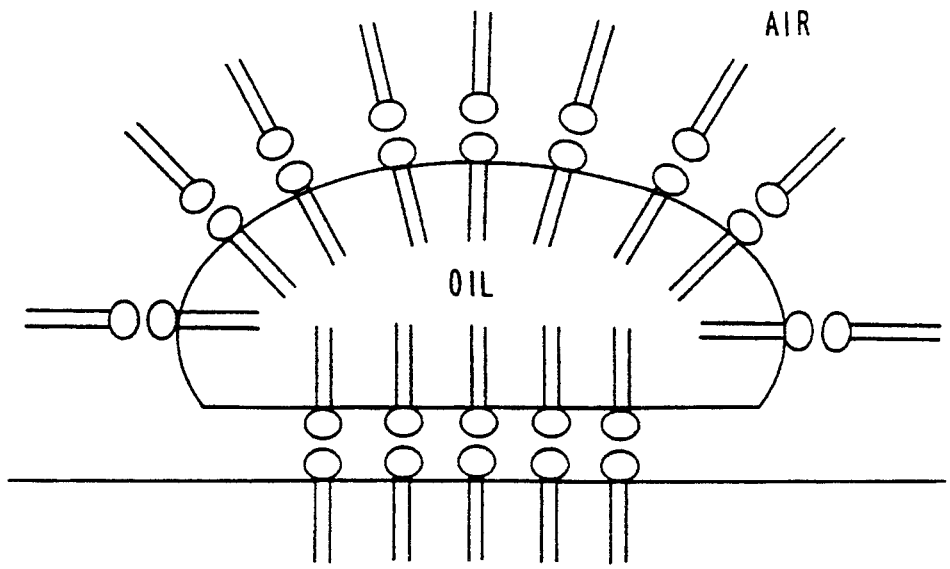
Figure 2B:
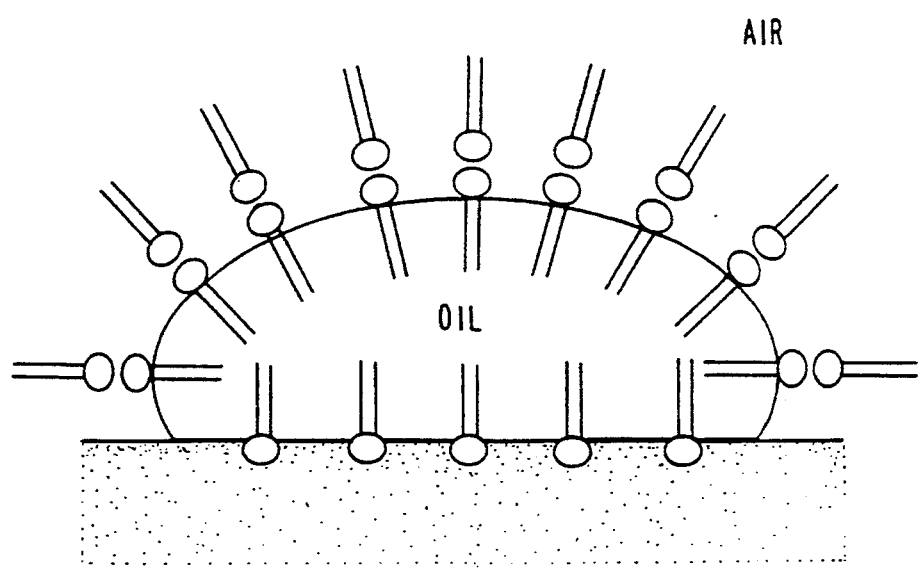

In the drawings:

FIG. 1 is a schematic representation of the physical state of an oil droplet on water, surrounded by phospholipids originating from liposomes, the non-polar tails of said phospholipids being directed towards the oil droplet and the polar heads of said phospholipids extending outwardly for interaction with the environment;

FIG. 2A-B is a schematic representation of the physical state of an oil droplet surrounded by phospholipids originating from liposomes which facilitate its adherence to hydrophobic or hydrophilic surfaces.

Addition of liposomes to an oil spill on water according to the present invention causes an immediate spreading of phospholipid molecules on the water surface, forming a monomolecular or biomolecular layer at the oil-water interface, thereby wetting the oil. The phospholipid molecules mediate between the oil and water by directing their hydrophobic fatty acid residues towards and/or within the oil phase while their polar headgroups are in contact with the water. The next step results in breaking up the continuous oil phase into droplets each of which is surrounded by a monomolecular layer of phospholipids. A likely arrangement of the phospholipid molecules at the respective oil-water and oil-air interfaces is shown in FIG. 1. These oil droplets are thus surrounded by a layer of phospholipoid molecules which prevents the formation of a continuous oil layer on the water surface. When using liposomes for interacting with oil on water, those phospholipid molecules which coat the oil droplets constitute a minor portion of the total liposomal content. Thus, the vast majority of the liposomes remain intact and serve as a reservoir for coating more oil once it reaches them.

Pouring oil on water which had been pretreated with liposomes resulted in its instant conversion to droplets (as per FIG. 1), thereby preventing its spreading, as a continuous phase, on the water surface. The oil stayed as condensed, non-spreadable drops of oil on the surface of phospholipid-water interface of the liposome-containing water.

Oil spread on water adheres poorly to solid surfaces. This is not so when the oil is converted to droplets surrounded by phospholipid molecules. Then it adheres to numerous surfaces and its removal from the water by skimming is facilitated. The precise molecular organization of the phospholipid layer, surrounding the oil-drop at the solid surface, probably depends on whether the latter is hydrophobic (FIG. 2A) or hydrophilic (FIG. 2B). The above observations therefore show that the use of liposome will broaden the spectrum of microorganism which can adhere to the oil and thereby facilitate its biodegradation.

EXAMPLE 1

Soil, contaminated with petroleum, collected at a local gas station was incubated in minimal medium, and bacteria which grew were collected. Innoculums of $3 \times 10^3$ of these bacteria were incubated in 1 ml minimal medium, in the absence and presence of increasing concentrations of unilamellar liposomes composed of S45-M (a soybean lecithin which we have modified by converting the primary amino phospholipids to their corresponding tertiary amino equivalents, to contain mostly the neutral phosphatidylcholine). After 5 days incubation at 30° C. the following values were obtained:

| Liposomes (% phospholipids) | Bacterial count per ml |
| --- | --- |
| 0.0 | $3 \times 10^3$ |
| 0.05 | $5 \times 10^7$ |
| 0.10 | $1 \times 10^9$ |
| 0.2 | $5 \times 10^6$ |
| 0.4 | $<10^3$ |
| 0.8 | $<10^3$ |

The above data indicate a 5-6 log stimulation of the bacterial growth by the liposomes at the optimal concentration of liposomal phospholipids.

EXAMPLE 2

An inoculum of $5 \times 10^3$ of the above bacteria was incubated with 0.5 ml minimal medium to which 0.15 ml of Alaskan crude oil was added. When S45-M liposomes (0.15%) were included in the medium, the number of bacteria after 3 days incubation at 20°-30° C. increased to more than $10^6$ per ml, whereas in the absence of liposomes no growth occurred and it remained identical to the inoculum. Thus, under these conditions (i.e. medium containing petroleum) the liposomes increased the bacterial growth by 2-3 logs.

EXAMPLE 3

The above experiment was repeated, except that various other liposomes exemplified replaced the S45-M, The following list serves to exemplify this:
  a. Soybean phosphatides ranging from 10-100% PC and containing various proportions of PE, PI and other lipids, b. Egg phosphatides ranging from 80–100% PC and 0–20% PE as well as small quantities of sphingomyelins.
c. Synthetic PCs containing such fatty acid as myristic, palmitic or stearic.
d. Egg or soybean PC which had been hydrogenated and is completely saturated.

After 3 days incubation at 20°–30° the bacterial count per ml ranged from $10^5$ to $10^6$, indicating a 2–3 log stimulation of the bacterial growth by the respective liposomes.

EXAMPLE 4

Soils contaminated with petroleum were obtained from the oil-loading terminal at Israel's southern port of Eilat. Two samples were collected: 1. A dry soil (code ECS-A); 2. A "wet", oily soil (code ECS-B). 2 g of each of the respective soils were incubated in 2 ml of distilled water in the absence or presence of S45-M liposomes (0.125–0.5%). Each flask also received 200 ul of $1^{14}C$-hexadecane. After 5 days incubation at 30° C. the bacterial count per ml as well as the quantity of $^{14}CO^2$ released from the radioactive hexadecane were determined.

| Soil | Soil without liposomes | Soil with liposomes Bacteria/ml | $^{14}C$-hexadecane oxidized |
|---|---|---|---|
| ECS-A | $3 \times 10^5$ | Average $4 \times 10^6$ | 0.1 ul |
| ECS-B | $3 \times 10^6$ | Average $4 \times 10^8$ | 0.08 ul |

These data indicate an enhancement by the liposomes of bacterial growth as well as an oxidation of the radiolabelled hexadecane to $^{14}CO^2$.

EXAMPLE 5

The above experiment was repeated, now using 40 ul of $1-^{14}C$ hexadecane and 0.25% S45-M liposomes. after 4 days incubation at 30° the results were as follows:

| | Without liposomes | | With liposomes | |
|---|---|---|---|---|
| Soil | bacteria/ml | $^{14}C$ hexadecane oxidized | bacteria/ml | $^{14}C$ hexadecane oxidized |
| ECS-A | $4 \times 10^6$ | 0.25 l | $9 \times 10^8$ | 0.30 l |
| ECS-B | $2 \times 10^4$ | 0.26 l | $4 \times 10^9$ | 0.49 l |

These data again indicate enhancement of bacterial growth and oxidation of the $^{14}C$-hexadecane by the presence of the liposome in the medium.

EXAMPLE 6

1 g each of the oil contaminated soils ECS-A and ECS-B were added to 20 ml of tap-water and incubated at 30° C. by shaking for 4 and 18 days in the absence and presence of increasing concentrations of S45-M liposomes.

| S45-M liposomes (%) | ECS-A bacteria/ml | | ECS-B bacteria/ml | |
|---|---|---|---|---|
| | 4 days | 18 days | 4 days | 18 days |
| 0 | $8 \times 10^5$ | $2 \times 10^6$ | $3 \times 10^5$ | $1 \times 10^6$ |
| 0.125 | $2 \times 10^7$ | $1 \times 10^9$ | $>10^{10}$ | $>10^{10}$ |
| 0.25 | $3 \times 10^7$ | $9 \times 10^8$ | $6 \times 10^9$ | $>10^{10}$ |
| 0.50 | — | $1 \times 10^2$ | $1 \times 10^7$ | $2 \times 10^8$ |

The data indicated about 2–3 log stimulation of liposomes of bacterial growth using the ECS-A and close to 5 log with the ECS-B soil. Optimal growth was obtained with 0.1–0.2% liposomal phospholipid. When incubation was continued for one more week, a heavy white-emulsion appeared in the flasks containing ECS-B and 0.25% as well as 0.50% liposomes.

EXAMPLE 7

Bacteria, $(2 \times 10^3)$ isolated from ECS-A and ECS-B soils were used to innoculate 5 ml distilled water containing 0.5 ml Alaskan crude oil in the absence or presence of liposomes. After 4 days incubation at 30° C., in bacteria dish no proliferate in flasks without liposomes whereas in the presence of S45-M liposomes, the bacterial count increased by 5 to 8 reaching to $3 \times 10^8$ ml. This indicates that the bacterial flora which grew on the oil-contaminated soil further proliferated by more than 5 logs in the presence of Alaska crude oil and liposomes.

EXAMPLE 8

1 g each of the "wet" oil-contaminated soil (ECS-B) was incubated in 3 ml distilled water with several liposomal preparations at 0.1–0.2% phospholipid. After 8 and 13 day incubation at 30° C. the following values were observed.

| | Bacterial count per ml | |
|---|---|---|
| Liposome | 8th day | 13th day |
| S45-M (containing mostly PC) | $3 \times 10^5$ | $5 \times 10^4$ |
| S100 (purified soybean PC) | $8 \times 10^8$ | $7 \times 10^9$ |
| Egg PC | $1.2 \times 10^9$ | $>10^{10}$ |
| S45 (partially purified soybean) | $1.8 \times 10^9$ | $>10^{10}$ |
| Lecithin containing PC and PE | $6 \times 10^7$ | $6 \times 10^9$ |
| Hydrogenated, fully saturated PC | $1.6 \times 10^7$ | $8 \times 10^9$ |

The above data indicate that bacteria growth was stimulated by liposomes 3–500,000 fold, also that unsaturated PC is more efficient for enhancing bacterial growth than the saturated PC equivalent and the partially purified soybean lecithin (S45) still containing negatively charged lipids is somewhat less efficient than the product (S45-M) which we have obtained by converting the PE to PC.

EXAMPLE 9

50 g each of soils ECS-A or ECS-B were sprayed with 0.2 g soybean phosphatidylcholine (PC) in 10 ml hexane (final concentration 0.4% PC). The sprayed soils were dried in an oven at 105° and water was added as specified in the table. The flasks were incubated at 30° for 2 weeks. 1 g samples were collected, suspended in minimal medium and the bacterial count per ml determined.

| Soil | Liposomes | Water | Bacterial count per ml |
|---|---|---|---|
| ECS-A 5 g | — | 0.5 ml | $5 \times 10^5$ |
| " | + | — | $3 \times 10^3$ |
| " | + | 0.5 ml | $1 \times 10^7$ |
| " | + | 1.5 ml | $2 \times 10^7$ |
| ECS-B 10 g | — | 1.0 ml | $1 \times 10^5$ |
| " | + | — | $1.1 \times 10^3$ |
| " | + | 1.0 ml | $8 \times 10^8$ |
| " | + | 3.0 ml | $2 \times 10^9$ |

These data indicated that bacterial growth is dramatically enhanced when soils, contaminated with petroleum have been coated with phospholipids by spraying a solution of these lipids in the solvent (e.g., light petroleum, alcohols, chlorinated hydrocarbons or other suitable solvents) followed by hydration of the soil with water. In the absence of phospholipids, hydration increased bacterial growth by 2 logs. Coating the soil with phospholipids follow by hydration resulted in an increase of 4 to 6 logs of the bacterial population.

Phospholipids are natural compounds present in all membranes including those of human, animal, plants or microorganisms. Also, they are employed in routine clinical use as emulsifiers for intravenous infusion of emulsified lipids and for drug-delivery in humans. Recently, they have been used in fisheries for feeding fish. Thus, it is believed that they will have no toxic effects on marine flora and fauna and could therefore be applied to oil-wells, soils contaminated by oil or wastes, water or beaches without need for prolonged toxicological studies. Furthermore, because of their potential use as nutrients, the excess phospholipids will be biodegraded by microorganisms, thus eliminating any possibility of unforeseen hazards to the flora or fauna of the sea, its shore or underground water.

Small, unilamellar liposomes can be prepared in small scale by sonic irradiation or extrusion. For larger scale preparations dairy homogenizers could be employed, permitting preparation of many thousands of gallons of liposomes in a day. Nutrients, minerals and other growth factors can be added during the preparation of the liposomes, resulting in their encapsulation in the interior or alternatively, incorporation into the membrane of the liposomes, Also one could prepare a concentrated dispersion of liposomes (e.g. containing 20 or more percent of phospholipids in water) to facilitate delivery and on-the-spot dilution with water. Alternatively, in the presence of cryoprotectant agents, the liposomes could be lyophilized or spray-dried and delivered/stored as a dry powder.

Based on the above-mentioned stability studies, concentrated stocks of liposomes can be stored for prolonged periods and used when needed.

Being aqueous dispersions, the liposomes can be applied to the ground or water-surface by any means used for delivering water (e,g. spraying, flooding, etc). Alternatively, they could be dissolved in a light kerosene (e.g. hexane) and sprayed on the oily surface, thereby combining two processes, i.e. delivery of phospholipid and softening of the weathered oil or waste. Subsequent application of water, following evaporation of the kerosene, will cause in situ swelling of the phospholipid and formation of liposomes at the site of the contaminated area.

Once optimal conditions are established for cleanup by physical means and enhanced biodegradation, a large-scale supply of suitable liposomes could be secured for use in emergencies (e.g., oil spills on water or beaches) or for an in-depth bioreclamation of contaminated soils.

It will be evident to those skilled in the art that the invention is not limited to the details of the foregoing illustrative examples and that the present invention may be embodied in other specific forms without departing from the essential attributes thereof, and it is therefore desired that the present embodiments and examples be considered in all respects as illustrative and not restrictive, reference being made to the appended claims, rather than to the foregoing description, and all changes which come within the meaning and range of equivalency of the claims are therefore intended to be embraced therein.

What is claimed is:

1. In a method for the biodegradation of biodegradable organic wastes, the improvement comprising applying liposomes having vesicles of a diameter of about 20–80 nm to a biodegradable organic waste site in the presence of organic waste-consuming microorganisms, wherein molecules originating from said liposomes supply essential nutrients for bacterial growth of said microorganisms, while concomitantly increasing the polarity, wettability and availability of said organic waste for enhanced bacterial interaction therewith.

2. A method according to claim 1 wherein said organic waste is selected from crude and refined hydrocarbons.

3. A method according to claim 1 wherein said organic waste is light or heavy crude oil.

4. A method according to claim 1 wherein said organic waste is gasoline.

5. A method according to claim 1 wherein said organic waste is an oil spill on water.

6. A method according to claim 1 wherein said organic waste site is contaminated soil.

7. A method according to claim 1 wherein said liposomes are phospholipid liposomes.

* * * * *